United States Patent
Fukamichi (10) Patent No.: US 12,226,806 B2
(45) Date of Patent: Feb. 18, 2025

(54) CLEANING SHEET AND TRANSFER MEMBER PROVIDED WITH CLEANING FUNCTION

(71) Applicant: NITTO DENKO CORPORATION, Ibaraki (JP)

(72) Inventor: Yuichi Fukamichi, Ibaraki (JP)

(73) Assignee: NITTO DENKO CORPORATION, Ibaraki (JP)

( * ) Notice: Subject to any disclaimer, the term of this patent is extended or adjusted under 35 U.S.C. 154(b) by 3 days.

(21) Appl. No.: 17/701,354

(22) Filed: Mar. 22, 2022

(65) Prior Publication Data
US 2022/0347727 A1    Nov. 3, 2022

(30) Foreign Application Priority Data
Apr. 28, 2021    (JP) .................. 2021-075692

(51) Int. Cl.
B08B 1/14    (2024.01)

(52) U.S. Cl.
CPC .................. B08B 1/143 (2024.01)

(58) Field of Classification Search
CPC ......... B08B 1/006; B08B 1/143; A47L 13/20; A47L 13/16; A47L 13/44; A47L 13/10; A47L 13/12; A47L 13/38; D04H 13/00; B32B 3/263; B32B 3/145; C09J 7/22
USPC .................. 15/229.4, 210.1; 134/8
See application file for complete search history.

(56) References Cited

U.S. PATENT DOCUMENTS

2006/0210774 A1 * 9/2006 Linzell ............ B08B 1/00
                                                   428/174
2007/0202768 A1 * 8/2007 Haskett ............ A47L 13/16
                                                   442/151
2012/0042902 A1 * 2/2012 Uenda ............ B08B 7/0028
                                                   15/118

FOREIGN PATENT DOCUMENTS

| JP | H10154686 A | 6/1998 |
| JP | H11087458 A | 3/1999 |
| JP | 2006216870 A | 8/2006 |
| JP | 2007307521 A | 11/2007 |
| JP | 2010259970 A | 11/2010 |

OTHER PUBLICATIONS

Japan Patent Office, Office Action Issued in Application No. 2021075692, Nov. 5, 2024, 7 pages.

* cited by examiner

*Primary Examiner* — Katina N. Henson
(74) *Attorney, Agent, or Firm* — Alleman Hall & Tuttle LLP (57) ABSTRACT

Provided is a cleaning sheet including a cleaning layer that may be suitably used for a transfer member to be transferred in a substrate processing apparatus, the cleaning sheet being capable of effectively suppressing an adsorption error. A direction from an end portion of a surface of the cleaning layer toward a center thereof when viewed from a normal direction with respect to the surface is defined as a center direction, a region occupied by a width of 10 mm from the end portion toward the center direction in the surface is defined as an end portion region, and a maximum thickness L of the cleaning layer in the normal direction in the end portion region and an average thickness T of the cleaning layer in the normal direction in a region of the cleaning layer excluding the end portion region have a relationship of $L-T \leq 5$ μm.

11 Claims, 5 Drawing Sheets

CLEANING SHEET AND TRANSFER MEMBER PROVIDED WITH CLEANING FUNCTION

CROSS REFERENCE TO RELATED APPLICATION

This application claims priority under 35 U.S.C. Section 119 to Japanese Patent Application No. 2021-075692 filed on Apr. 28, 2021, which is herein incorporated by references.

BACKGROUND OF THE INVENTION

1. Field of the Invention

The present disclosure relates to a cleaning sheet and a transfer member provided with a cleaning function.

2. Description of the Related Art

In various kinds of substrate processing apparatus that are liable to be damaged by foreign matter, such as a production apparatus and an inspection apparatus for a semiconductor, a flat panel display, a printed board, and the like, a transfer device (typically a chuck table or the like) and a substrate are transferred while being brought into physical contact with each other. In this case, when foreign matter adheres to the transfer device, the subsequent substrates are contaminated one after another, and hence it is necessary to stop the apparatus periodically so as to clean the apparatus. As a result, there arise problems in that the operation rate of the processing apparatus decreases, and that a great amount of time and labor are required for cleaning the apparatus.

In order to solve such problems as described above, a method of removing foreign matter adhering to a transfer device by transferring a plate-shaped member in a substrate processing apparatus (see Japanese Patent Application Laid-open No. Heisei 11-87458) has been proposed. According to the method, it is not necessary to stop a substrate processing apparatus so as to clean the apparatus, and hence the problem of a decrease in the operation rate of the processing apparatus is solved. According to the method, however, it has been impossible to sufficiently remove the foreign matter adhering to the transfer device.

Meanwhile, a method of removing foreign matter adhering to a transfer device by transferring a substrate with an adherent material adhering thereto as a cleaning member in a substrate processing apparatus (see Japanese Patent Application Laid-open No. Heisei 10-154686) has been proposed. This method provides excellent foreign matter removing performance as compared to the method described in Japanese Patent Application Laid-open No. Heisei 11-87458.

In the method described in Japanese Patent Application Laid-open No. Heisei 10-154686, however, there may arise a problem in that the adherent material and the transfer device are bonded to each other so strongly in a contact portion therebetween that the material and the device are not separated from each other. As a result, there may arise a problem in that the substrate with the adherent material adhering thereto cannot be securely transferred, a problem in that the transfer device is damaged, and a problem in that the transfer device is contaminated. Meanwhile, when an adhesive strength between the adherent material and the transfer device becomes excessively weak, there may arise a problem in that the foreign matter removing performance of the cleaning member reduces, and hence a sufficient cleaning effect is not obtained.

As means for solving such various problems as described above and the like, the applicant has disclosed a cleaning sheet including a cleaning layer, which adopts a polymer component as a material for the cleaning layer serving as a cleaning member and may be suitably used for a transfer member to be transferred in a substrate processing apparatus (Japanese Patent Application Laid-open No. 2007-307521 and Japanese Patent Application Laid-open No. 2010-259970).

When the polymer component is adopted as a material for the cleaning layer, the cleaning layer is typically formed as described below.

Varnish containing the polymer component serving as a material for the cleaning layer is applied onto the surface of any appropriate substrate (e.g., the mirror surface of a silicon wafer) by spin coating, and is subjected to heating, drying, or the like as required to form the layer on the substrate.

However, when a transfer device (typically a chuck table or the like) is cleaned with a cleaning sheet or a transfer member provided with a cleaning function including the cleaning layer obtained as described above, vacuum adsorption is generally performed by mounting the cleaning sheet or the transfer member provided with a cleaning function on the adsorption stage of the transfer device so that the cleaning layer side of the sheet or the member may face toward the adsorption stage. However, an adsorption error may occur in the vacuum adsorption.

SUMMARY OF THE INVENTION

An object of the present disclosure is to provide a cleaning sheet including a cleaning layer that may be suitably used for a transfer member to be transferred in a substrate processing apparatus, the cleaning sheet being capable of effectively suppressing an adsorption error when the cleaning layer is caused to adsorb to an adsorption stage or the like. Another object of the present disclosure is to provide a transfer member provided with a cleaning function including such cleaning sheet and a transfer member.

The applicant has made an investigation on a cause for the adsorption error. Then, the applicant has made a detailed investigation while paying attention to the following property as means for causing the cleaning layer side of a cleaning sheet or a transfer member provided with a cleaning function to vacuum-adsorb onto the adsorption stage of a transfer device: a sealing property between a contact sealing member, such as a sealing band, arranged on the adsorption stage and the cleaning layer. As a result, the applicant has revealed that when a rising portion (crown) is formed in the peripheral edge portion of the cleaning layer of the cleaning sheet or the transfer member provided with a cleaning function to be caused to vacuum-adsorb onto the adsorption stage, and the crown has a rise equal to or more than a predetermined size, the adsorption error occurs. In view of the foregoing, the applicant has made investigations on a method of suppressing the adsorption error through appropriate adjustment of the size of the crown, and has completed the present disclosure.

According to at least one embodiment of the present disclosure, there is provided a cleaning sheet, including a cleaning layer, wherein a direction from an end portion of a surface of the cleaning layer toward a center thereof when viewed from a normal direction with respect to the surface is defined as a center direction, a region occupied by a width of 10 mm from the end portion toward the center direction in the surface is defined as an end portion region, and a maximum thickness L of the cleaning layer in the normal direction in the end portion region and an average thickness T of the cleaning layer in the normal direction in a region of the cleaning layer excluding the end portion region have a relationship of L−T≤5 μm.

In at least one embodiment, a portion having a thickness larger than the average thickness T in the cleaning layer by 1 μm or more has a width of 4,000 μm or less in the center direction.

In at least one embodiment, the cleaning layer contains at least one kind selected from the group consisting of a polyimide-based resin and a polybenzoxazole-based resin.

In at least one embodiment, the cleaning layer has a thickness of from 1 μm to 100 μm.

In at least one embodiment, the cleaning sheet further includes a pressure-sensitive adhesive layer.

In at least one embodiment, the cleaning sheet further includes a support.

According to at least one embodiment of the present disclosure, there is provided a modified transfer member provided with a cleaning function, including the cleaning sheet and a transfer member.

DESCRIPTION OF THE EMBODIMENTS

1. Cleaning Sheet

A cleaning sheet according to at least one embodiment of the present disclosure includes a cleaning layer.

The cleaning sheet according to at least one embodiment of the present disclosure may include only the cleaning layer, or may include any other layer.

Figure 1:
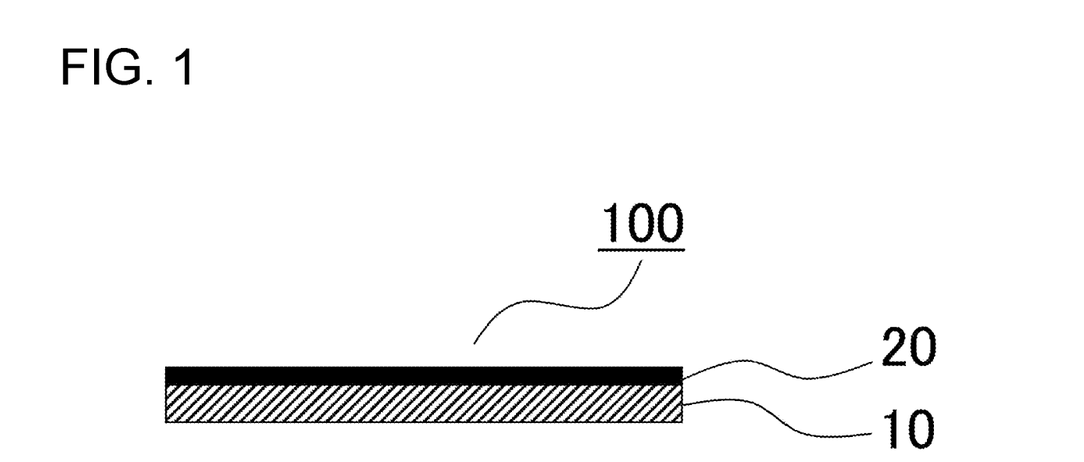
FIG. 1 is a schematic cross-sectional view for illustrating a cleaning sheet according to at least one embodiment of the present disclosure.

FIG. 1 is a schematic cross-sectional view for illustrating a cleaning sheet according to at least one embodiment of the present disclosure. In FIG. 1, a cleaning sheet 100 includes a cleaning layer 10 and a protective film 20. The protective film 20 may be arranged for the purpose of, for example, protecting the cleaning layer 10, and may be omitted in accordance with purposes. That is, the cleaning sheet according to at least one embodiment of the present disclosure may include only the cleaning layer 10.

Figure 2:
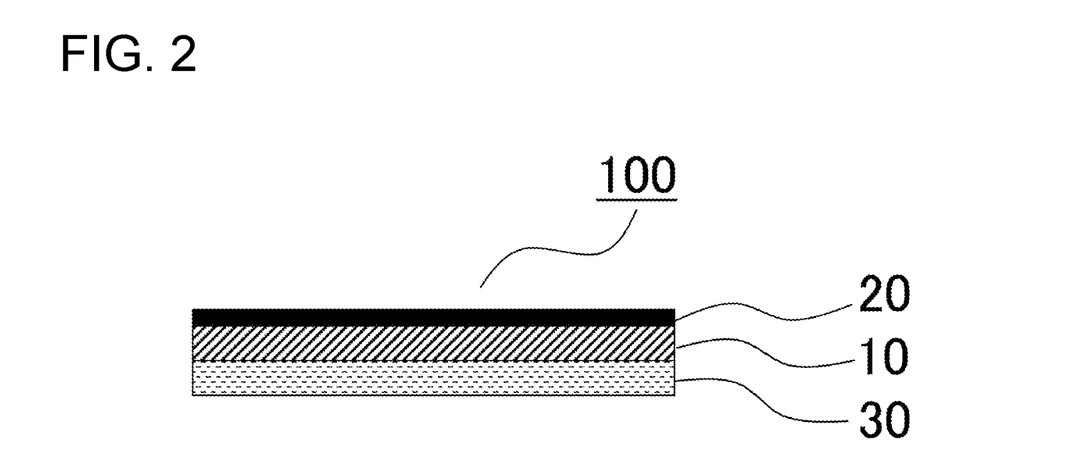
FIG. 2 is a schematic cross-sectional view for illustrating a cleaning sheet according to at least one embodiment of the present disclosure.

FIG. 2 is a schematic cross-sectional view for illustrating a cleaning sheet according to at least one embodiment of the present disclosure. In FIG. 2, the cleaning sheet 100 includes the protective film 20, the cleaning layer 10, and a pressure-sensitive adhesive layer 30. The protective film 20 may be arranged for the purpose of, for example, protecting the cleaning layer 10, and may be omitted in accordance with purposes.

Figure 3:
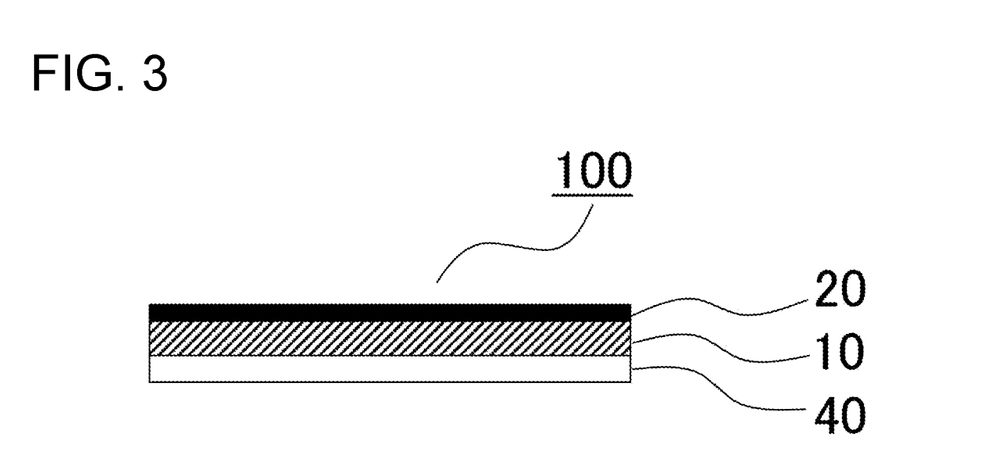
FIG. 3 is a schematic cross-sectional view for illustrating a cleaning sheet according to at least one embodiment of the present disclosure.

FIG. 3 is a schematic cross-sectional view for illustrating a cleaning sheet according to at least one embodiment of the present disclosure. In FIG. 3, the cleaning sheet 100 includes the protective film 20, the cleaning layer 10, and a support 40. The protective film 20 may be arranged for the purpose of, for example, protecting the cleaning layer 10, and may be omitted in accordance with purposes.

Figure 4:
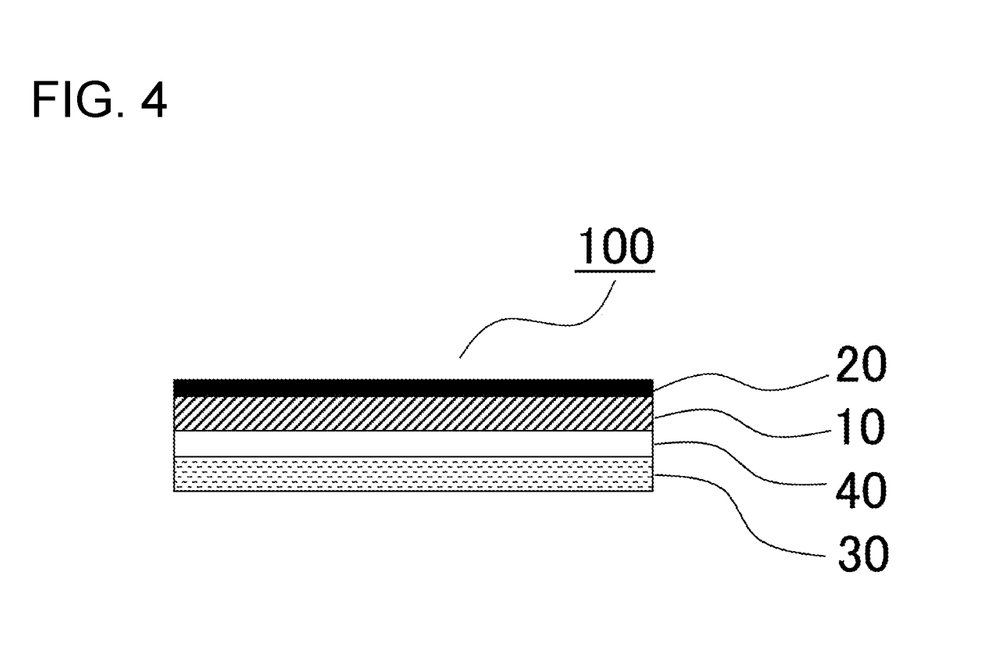
FIG. 4 is a schematic cross-sectional view for illustrating a cleaning sheet according to at least one embodiment of the present disclosure.

FIG. 4 is a schematic cross-sectional view for illustrating a cleaning sheet according to at least one embodiment of the present disclosure. In FIG. 4, the cleaning sheet 100 includes the protective film 20, the cleaning layer 10, the support 40, and the pressure-sensitive adhesive layer 30. The protective film 20 may be arranged for the purpose of, for example, protecting the cleaning layer 10, and may be omitted in accordance with purposes.

Any appropriate thickness may be adopted as the thickness of the cleaning sheet according to at least one embodiment of the present disclosure in accordance with its configuration (in particular, for example, whether or not the sheet includes a support or a pressure-sensitive adhesive layer, and how thick the support or the layer is).

Figure 5:
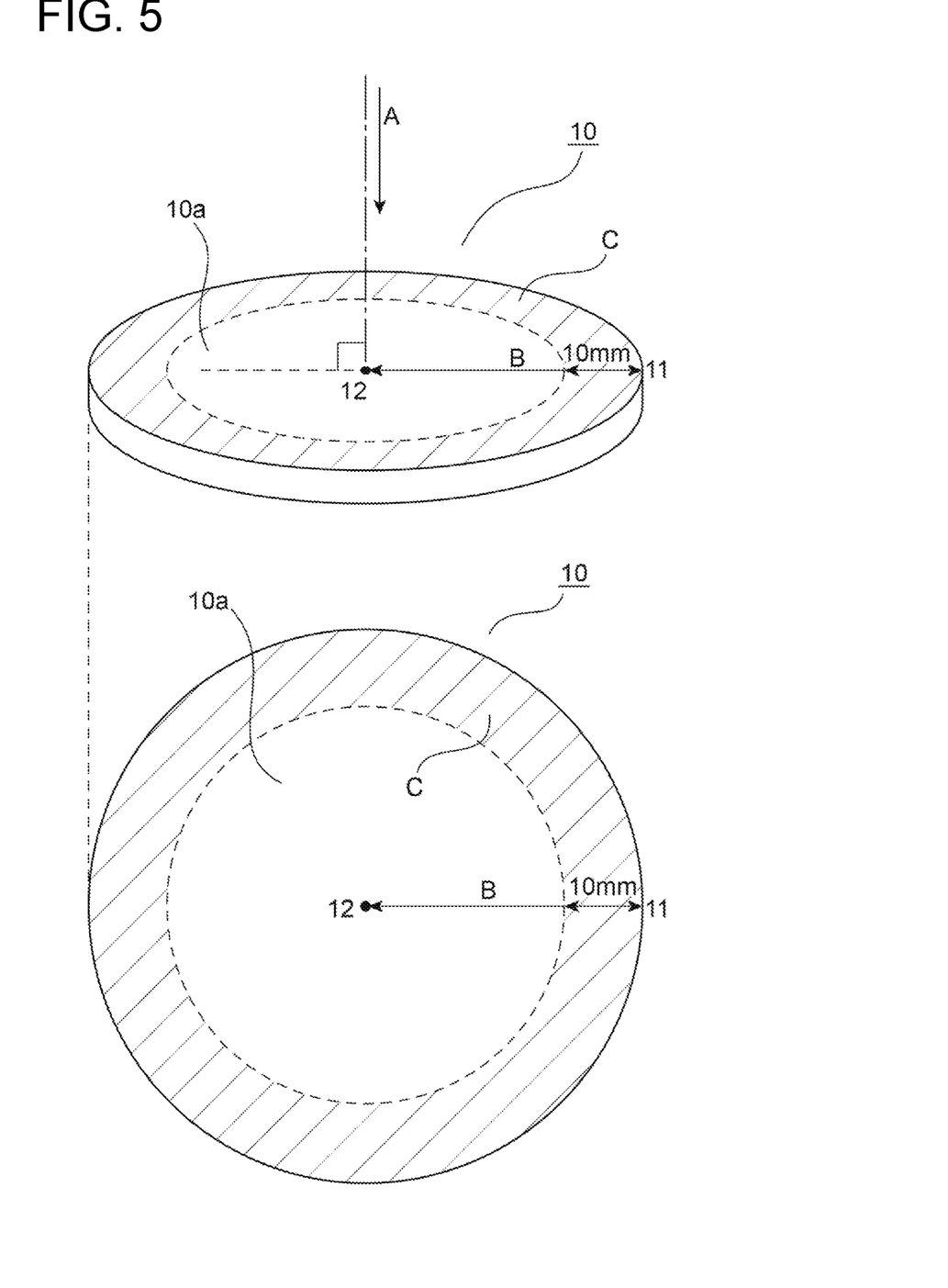
FIG. 5 is a schematic explanatory view for illustrating a normal direction, a center direction, and an end portion region in the cleaning sheet according to at least one embodiment of the present disclosure.

In the cleaning sheet according to at least one embodiment of the present disclosure, as illustrated in FIG. 5, a direction from an end portion 11 of a surface 10a of the cleaning layer 10 toward a center 12 thereof when viewed from a normal direction A with respect to the surface 10a is defined as a center direction B.

In the cleaning sheet according to at least one embodiment of the present disclosure, as illustrated in FIG. 5, a region occupied by a width of 10 mm from the end portion 11 toward the center direction B in the surface 10a of the cleaning layer 10 is defined as an end portion region C.

Figure 6:
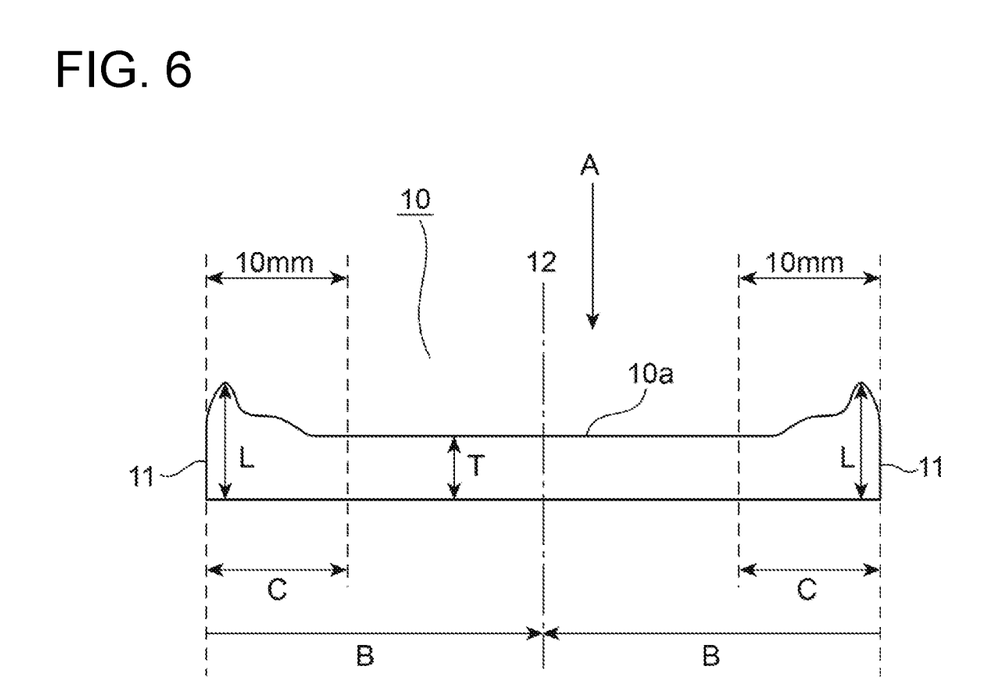
FIG. 6 is a schematic cross-sectional view for illustrating a difference (L−T) between the maximum thickness L of a cleaning layer in the normal direction in the end portion region in the cleaning sheet according to at least one embodiment of the present disclosure and the average thickness T of the cleaning layer in the normal direction in the region of the cleaning layer except the end portion region.

The cleaning sheet according to at least one embodiment of the present disclosure can effectively suppress an adsorption error when the cleaning layer is caused to adsorb to an adsorption stage or the like through appropriate adjustment of the size of a rising portion (crown) to be formed in the peripheral edge portion of the cleaning layer. In at least one embodiment of the present disclosure, as an indicator for appropriately adjusting the size of the crown, as illustrated in FIG. 6 that is a schematic cross-sectional view passing through the center 12 of the cleaning layer 10, a difference (L−T) between a maximum thickness L of the cleaning layer 10 in the normal direction A in the end portion region C and an average thickness T of the cleaning layer 10 in the normal direction A in the region of the cleaning layer 10 except the end portion region C is adopted. As a result, the applicant has revealed that in the case where the difference is appropriately set, the adsorption error when the cleaning layer is caused to adsorb to the adsorption stage or the like can be effectively suppressed.

That is, in the cleaning sheet according to at least one embodiment of the present disclosure, the maximum thickness L of the cleaning layer 10 in the normal direction A in the end portion region C and the average thickness T of the cleaning layer 10 in the normal direction A in the region of the cleaning layer 10 except the end portion region C have a relationship of L−T≤5 μm, preferably L−T≤4.5 μm, more preferably L−T≤4.0 μm, even more preferably L−T≤3.5 μm, particularly preferably L−T≤3.0 μm, and most preferably L−T≤2.5 μm. When the difference L−T falls within the ranges, the adsorption error when the cleaning layer is caused to adsorb to the adsorption stage or the like can be effectively suppressed. In the case where the difference L−T becomes larger to deviate from the ranges, when the cleaning layer is caused to vacuum-adsorb to, for example, the adsorption stage of a transfer device, a gap, albeit slight, is assumed to occur between a contact sealing member, such as a sealing band, arranged on the adsorption stage and the cleaning layer. The gap may be responsible for the impairment of a sealing property for holding a vacuum state to cause the adsorption error.

Figure 7:
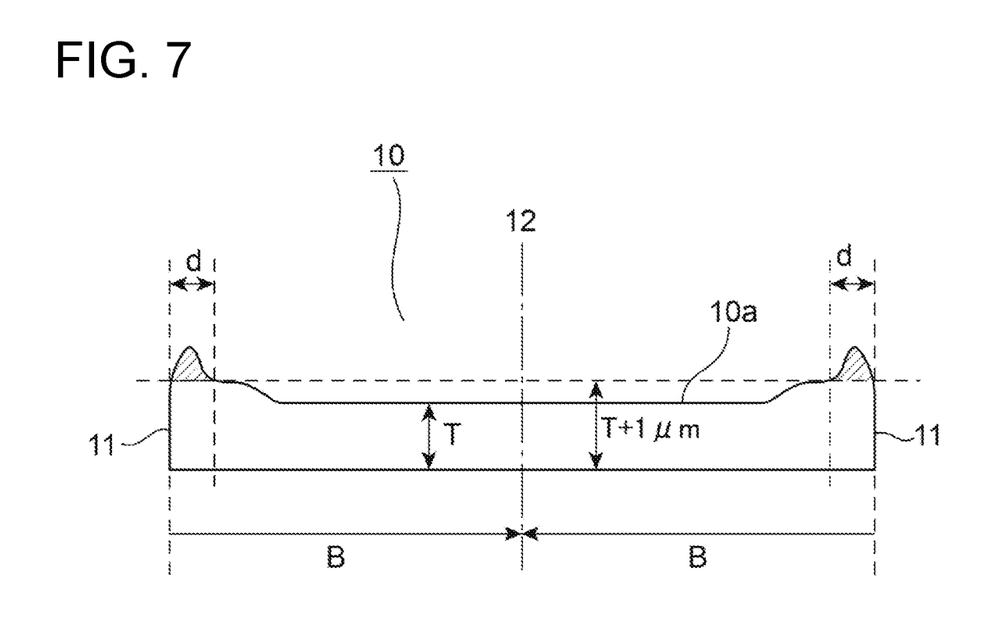
FIG. 7 is a schematic cross-sectional view for illustrating the width of a portion having a thickness larger than the average thickness T in the cleaning layer by 1 μm or more in the center direction in the cleaning sheet according to at least one embodiment of the present disclosure.

In the cleaning sheet according to at least one embodiment of the present disclosure, as illustrated in FIG. 7, a width d of a portion having a thickness larger than the average thickness T in the cleaning layer 10 by 1 μm or more in the center direction B is preferably 4,000 μm or less because the effects of the present disclosure can be further expressed. When the width d of the portion having a thickness larger than the average thickness T in the cleaning layer by 1 μm or more in the center direction falls within the ranges, the adsorption error when the cleaning layer is caused to adsorb to the adsorption stage or the like can be more effectively suppressed. In the case where the width d of the portion having a thickness larger than the average thickness T in the cleaning layer by 1 μm or more in the center direction becomes larger to deviate from the ranges, when the cleaning layer is caused to vacuum-adsorb to, for example, the adsorption stage of a transfer device, a gap, albeit slight, is assumed to occur between a contact sealing member, such as a sealing band, arranged on the adsorption stage and the cleaning layer. The gap may be responsible for the impairment of a sealing property for holding a vacuum state to cause the adsorption error.

1-1. Cleaning Layer

The cleaning layer preferably contains at least one kind selected from the group consisting of a polyimide-based resin and a polybenzoxazole-based resin because the effects of the present disclosure can be expressed.

The polyimide-based resin is preferably a polyimide-based resin having introduced thereinto a soft segment because the effects of the present disclosure can be further expressed. The polybenzoxazole-based resin is preferably a polybenzoxazole-based resin having introduced thereinto a soft segment because the effects of the present disclosure can be further expressed. Accordingly, the cleaning layer preferably contains at least one kind selected from the group consisting of the polyimide-based resin having introduced thereinto the soft segment and the polybenzoxazole-based resin having introduced thereinto the soft segment because the effects of the present disclosure can be further expressed.

Any appropriate soft segment may be adopted as the soft segment to the extent that the effects of the present disclosure are not impaired as long as the soft segment is referred to as a so-called "soft segment" that can impart flexibility to a polymer.

The content of the at least one kind selected from the group consisting of the polyimide-based resin and the polybenzoxazole-based resin in the cleaning layer is preferably from 50 wt % to 100 wt %, more preferably from 70 wt % to 100 wt %, even more preferably from 90 wt % to 100 wt %, particularly preferably from 95 wt % to 100 wt %, and most preferably from 98 wt % to 100 wt % because the effects of the present disclosure can be sufficiently expressed.

Any appropriate polyimide-based resin may be adopted as the polyimide-based resin to the extent that the effects of the present disclosure are not impaired.

The polyimide-based resin is preferably a polyimide-based resin obtained by imidizing a polyamic acid because the effects of the present disclosure can be further expressed. The polyamic acid may be typically obtained by subjecting a tetracarboxylic dianhydride component and a diamine component to a reaction in any appropriate organic solvent at a substantially equimolar ratio.

Examples of the tetracarboxylic dianhydride component include 3,3',4,4'-biphenyltetracarboxylic dianhydride, 2,2',3,3'-biphenyltetracarboxylic dianhydride, 3,3',4,4'-benzophenonetetracarboxylic dianhydride, 2,2',3,3'-benzophenonetetracarboxylic dianhydride, 4,4'-oxydiphthalic dianhydride, 2,2-bis(2,3-dicarboxyphenyl)hexafluoropropane dianhydride, 2,2-bis(3,4-dicarboxyphenyl)hexafluoropropane dianhydride (6FDA), bis(2,3-dicarboxyphenyl)methane dianhydride, bis(3,4-dicarboxyphenyl)methane dianhydride, bis(2,3-dicarboxyphenyl)sulfone dianhydride, bis(3,4-dicarboxyphenyl)sulfone dianhydride, pyromellitic dianhydride, and ethylene glycol bistrimellitic dianhydride. Those components may be used alone or in combination thereof.

Examples of the diamine component include a diamine compound having at least two terminals each having an amine structure and having a polyether structure (hereinafter sometimes referred to as "PE diamine compound"), an aliphatic diamine, and an aromatic diamine. Of those, a PE diamine compound is preferred as the diamine component because the effects of the present disclosure can be further expressed.

Any appropriate compound may be adopted as the PE diamine compound as long as the compound has a polyether structure and at least two terminals each having an amine structure. Examples of the PE diamine compound include a terminal diamine having a polypropylene glycol structure, a terminal diamine having a polyethylene glycol structure, a terminal diamine having a polytetramethylene glycol structure, and a terminal diamine having a plurality of those structures. A more specific example of the PE diamine compound is a PE diamine compound having at least two terminals each having an amine structure prepared from ethylene oxide, propylene oxide, polytetramethylene glycol, polyamine, or a mixture thereof. Each of those PE diamine compounds has introduced thereinto the polyether structure as a soft segment, and hence enables further expression of the effects of the present disclosure. That is, the PE diamine compound is a polyimide-based resin having introduced thereinto a soft segment.

Examples of the aliphatic diamine include ethylenediamine, hexamethylenediamine, 1,8-, 1,10-diaminodecane, 1,12-diaminododecane, 4,9-dioxa-1,12-diaminododecane, and 1,3-bis(3-aminopropyl)-1,1,3,3-tetramethyldisiloxane (α,ω-bisaminopropyltetramethyldisiloxane). The aliphatic diamine has a molecular weight of preferably from 50 to 1,000,000, more preferably from 100 to 30,000.

Examples of the aromatic diamine include 4,4'-diaminodiphenyl ether, 3,4'-diaminodiphenyl ether, 3,3'-diaminodiphenyl ether, m-phenylenediamine, p-phenylenediamine, 4,4'-diaminodiphenylpropane, 3,3'-diaminodiphenylmethane, 4,4'-diaminodiphenyl sulfide, 3,3'-diaminodiphenyl sulfide, 4,4'-diaminodiphenyl sulfone, 3,3'-diaminodiphenyl sulfone, 1,4-bis(4-aminophenoxy)benzene, 1,3-bis(4-aminophenoxy)benzene, 1,3-bis(3-aminophenoxy)benzene, 1,3-bis(4-aminophenoxy)-2,2-dimethylpropane, and 4,4'-diaminobenzophenone.

Examples of the organic solvent used for the reaction between the tetracarboxylic dianhydride and the diamine include N,N-dimethylacetamide, N-methyl-2-pyrrolidone, and N,N-dimethylformamide. A non-polar solvent (e.g., toluene or xylene) may be used in combination therewith for adjusting the solubility of the raw material or the like.

The temperature of the reaction between the tetracarboxylic dianhydride and the diamine is preferably 40° C. or more, more preferably from 50° C. to 150° C.

The imidization of the polyamic acid is typically performed by heat treatment under an inert atmosphere (typically vacuum or nitrogen atmosphere). The temperature of the heat treatment is preferably 150° C. or more, more preferably from 180° C. to 450° C.

The polybenzoxazole-based resin is a resin having heat resistance and an insulating property. The polybenzoxazole-based resin is preferably modified polybenzoxazole obtained by introducing a soft segment into polybenzoxazole because the effects of the present disclosure can be expressed. That is, the modified polybenzoxazole is a polybenzoxazole-based resin having introduced thereinto a soft segment.

Any appropriate soft segment may be adopted as the soft segment in the modified polybenzoxazole to the extent that the effects of the present disclosure are not impaired as long as the soft segment is referred to as a so-called "soft segment" that can impart flexibility to a polymer. Of such soft segments, a soft segment having a repeating skeleton represented by at least one kind selected from $-(O-R)_n-$ and $-(O-COO-R)_n-$ is preferred because the effects of the present disclosure can be further expressed. The number of kinds of the skeletons $-(O-R)_n-$ that may be incorporated into the soft segment may be only one, or may be two or more. The number of kinds of the skeletons $-(O-COO-R)_n-$ that may be incorporated into the soft segment may be only one, or may be two or more.

In the repeating skeleton represented by at least one kind selected from $-(O-R)_n-$ and $-(O-COO-R)_n-$, R represents an alkylene group having 2 to 18 carbon atoms, and "n" represents a number of from 1 to 100. R represents preferably an alkylene group having 2 to 12 carbon atoms, more preferably an alkylene group having 3 to 10 carbon atoms, even more preferably an alkylene group having 3 to 6 carbon atoms, particularly preferably an alkylene group having 3 or 4 carbon atoms. "n" represents preferably a number of from 5 to 90, more preferably a number of from 10 to 70, particularly preferably a number of from 10 to 50.

The modified polybenzoxazole may be preferably produced by using a compound (S) having a repeating skeleton represented by at least one kind selected from $-(O-R)_n-$ and $-(O-COO-R)_n-$. Such compound (S) preferably has, at each of both of its terminals, a functional group that reacts with a chloride (—Cl). Examples of such functional group include an amino group, a substituted amino group, and a hydroxy group.

Examples of the compound (S) include $H_2N-R^1-(O-R)_n-R^2-NH_2$, $H_2N-R^1-(O-COO-R)_n-R^2-NH_2$, $HO-R^1-(O-R)_n-R^2-OH$, and $HO-R^1-(O-COO-R)_n-R^2-OH$. Herein, $R^1$ and $R^2$ may each independently represent a single bond or an alkylene group having 1 to 18 carbon atoms (preferably 2 to 12 carbon atoms, more preferably 3 to 10 carbon atoms, even more preferably 3 to 6 carbon atoms, particularly preferably 3 or 4 carbon atoms). As described above, the number of kinds of the skeletons $-(O-R)_n-$ may be only one, or may be two or more, and the number of kinds of the skeletons $-(O-COO-R)_n-$ may be only one, or may be two or more. That is, for example, when description is given by taking $H_2N-R^1-(O-R)_n-R^2-NH_2$ as an example, the skeleton $-(O-R)_n-$ may be represented by $-(O-CH_2-CH(CH_3))_x-(O-CH_2-CH_2)_y-(O-CH_2-CH(CH_3))_z-$ (where "x", "y", and "z" each independently represent a number of from 1 to 100).

The molecular weight of the compound (S) is preferably from 300 to 3,500, more preferably from 500 to 3,000, even more preferably from 600 to 2,500, particularly preferably from 800 to 2,200 because the effects of the present disclosure can be further expressed.

The blending ratio of the compound (S) with respect to the total amount of an amine component to be used for the production of the modified polybenzoxazole having the soft segment (sometimes referred to as "soft segment ratio") is preferably from 2 mol % to 40 mol %, more preferably from 3 mol % to 35 mol %, even more preferably from 5 mol % to 32 mol %, particularly preferably from 8 mol % to 31 mol %, most preferably from 10 mol % to 30 mol % in terms of molar ratio because the effects of the present disclosure can be further expressed.

An example of a method of producing the modified polybenzoxazole with the compound (S) is a method including loading 4,4'-(hexafluoroisopropylidene)bis(2-aminophenol), the soft segment, pyridine, and N-methyl-2-pyrrolidone into a separable flask mounted with a stirring device; stirring the mixture at room temperature until the respective materials are completely dissolved; then dropping trimethylchlorosilane into the flask over a predetermined time period (e.g., 1 minute); stirring the mixture for a predetermined time period (e.g., 60 minutes) at a predetermined temperature (e.g., room temperature); then slowly adding 4,4'-bis(chlorocarbonyl)diphenyl ether to the flask over a predetermined time period (e.g., 5 minutes); stirring the mixture at a predetermined temperature (e.g., room temperature) for a predetermined time period (e.g., 5 hours); dropping the resultant synthesized liquid into a predetermined amount (e.g., 2 L) of ion-exchanged water; drying the resultant precipitate at a predetermined temperature (e.g., 100° C.) for a predetermined time period (e.g., 24 hours); adding a predetermined amount (e.g., a 4-fold amount) of N-methyl-2-pyrrolidone to the precipitate after the drying to redissolve the precipitate so that the varnish of the modified polybenzoxazole may be obtained; applying the resultant varnish of the modified polybenzoxazole onto the mirror surface of a silicon wafer by spin coating; heating the varnish at a predetermined temperature (e.g., 150° C.) for a predetermined time period (e.g., 30 minutes) to remove N-methyl-2-pyrrolidone; and then heating the residue under a vacuum at a predetermined temperature (e.g., 300° C.) for a predetermined time period (e.g., 2 hours).

Any appropriate other component may be incorporated into the cleaning layer to the extent that the effects of the present disclosure are not impaired. Examples of such other component include a heat-resistant resin except the polyimide-based resin and the polybenzoxazole-based resin, a surfactant, a plasticizer, an antioxidant, a conductivity providing agent, a UV absorber, and a photostabilizer.

The thickness of the cleaning layer is preferably from 1 µm to 100 µm, more preferably from 1 µm to 50 µm, even more preferably from 1 µm to 30 µm, particularly preferably from 1 µm to 20 µm, most preferably from 2 µm to 10 µm. When the thickness of the cleaning layer falls within the ranges, the effects of the present disclosure can be further expressed.

The cleaning layer is preferably substantially free of an adhesive ability. More specifically, for example, a cleaning layer formed of an adherent material and a cleaning layer formed by fixing a pressure-sensitive adhesive tape are excluded from the cleaning layer in at least one embodiment of the present disclosure. When the cleaning sheet according to at least one embodiment of the present disclosure includes a cleaning layer substantially having an adhesive ability, the cleaning layer and for example, a transfer device in a substrate processing apparatus may be bonded to each other so strongly in a contact portion therebetween that the layer and the device are not separated from each other. As a result, there may arise a problem in that a substrate cannot be securely transferred and a problem in that the transfer device is damaged.

As described above, it is preferred that the cleaning layer be substantially free of an adhesive ability. Specifically, the layer has a 180° peeling adhesion A of preferably less than 0.20 N/10 mm, more preferably from 0.01 N/10 mm to 0.10 N/10 mm, which is defined by JIS-Z-0237 with respect to the mirror surface of a silicon wafer. When the 180° peeling adhesion A of the cleaning layer, which is defined by JIS-Z-0237 with respect to the mirror surface of the silicon wafer, falls within such ranges, the cleaning layer is substantially free of an adhesive ability, and hence the pressure-sensitive adhesive property of a contact portion between the cleaning layer and for example, a transfer device in a substrate processing apparatus can be reduced. As a result, a substrate can be securely transferred, and the transfer device may be hardly damaged.

The cleaning layer has a 180° peeling adhesion B of preferably 10 N/10 mm or more, more preferably 15 N/10 mm or more, even more preferably 20 N/10 mm or more, particularly preferably 25 N/10 mm or more, most preferably 30 N/10 mm or more, which is defined by JIS-Z-0237 with respect to the mirror surface of a dummy wafer. When the 180° peeling adhesion B of the cleaning layer, which is defined by JIS-Z-0237 with respect to the mirror surface of the dummy wafer, falls within the ranges, for example, adhesiveness between the cleaning layer and a transfer member, such as the dummy wafer, becomes higher, and hence the cleaning layer hardly peels from the transfer member, such as the dummy wafer, during cleaning.

The 180° peeling adhesion B of the cleaning layer, which is defined by JIS-Z-0237 with respect to the mirror surface of the dummy wafer, may be measured, for example, as follows: the cleaning layer is formed on the mirror surface of a silicon wafer serving as the dummy wafer, and its peeling adhesion is measured in conformity with JIS-Z-0237.

1-2. Support

The cleaning sheet according to at least one embodiment of the present disclosure may include a support. The support may be a single layer, or may be a multilayered body.

Any appropriate thickness may be adopted as the thickness of the support to the extent that the effects of the present disclosure are not impaired. Such thickness is preferably 500 µm or less, more preferably from 1 µm to 400 µm, even more preferably from 1 µm to 300 µm, particularly preferably from 1 µm to 200 µm, and most preferably from 1 µm to 100 µm.

Any appropriate support may be adopted as the support to the extent that the effects of the present disclosure are not impaired. Examples of such support include films made of plastic, engineering plastic, and super engineering plastic. Specific examples of the plastic, the engineering plastic, and the super engineering plastic include polyimide, polyethylene, polyethylene terephthalate, acetyl cellulose, polycarbonate, polypropylene, and polyamide.

Various physical properties such as a molecular weight of a material for the support may be appropriately selected in accordance with purposes.

A method of forming the support may be appropriately selected in accordance with purposes.

The surface of the support may be subjected to conventional surface treatment, for example, chemical or physical treatment, such as chromic acid treatment, ozone exposure, flame exposure, high-pressure shock exposure, and ionized radiation treatment, or coating treatment with an undercoating agent, in order to enhance its adhesiveness with respect to an adjacent layer, retention property, and the like.

1-3. Pressure-Sensitive Adhesive Layer

The cleaning sheet according to at least one embodiment of the present disclosure may include a pressure-sensitive adhesive layer. Any appropriate material may be adopted as a material for such pressure-sensitive adhesive layer to the extent that the effects of the present disclosure are not impaired. For example, an acrylic pressure-sensitive adhesive, a silicone-based pressure-sensitive adhesive, a rubber-based pressure-sensitive adhesive, or a urethane-based pressure-sensitive adhesive may be adopted as a material for such pressure-sensitive adhesive layer.

The pressure-sensitive adhesive layer is arranged for, for example, bonding the cleaning sheet to the mirror surface of a dummy wafer. Thus, the cleaning sheet according to at least one embodiment of the present disclosure is bonded to the dummy wafer serving as a transfer member, and hence a transfer member provided with a cleaning function according to at least one embodiment of the present disclosure can be obtained.

The pressure-sensitive adhesive layer has a 180° peeling adhesion C of preferably 10 N/10 mm or more, more preferably 15 N/10 mm or more, even more preferably 20 N/10 mm or more, particularly preferably 25 N/10 mm or more, most preferably 30 N/10 mm or more, which is defined by JIS-Z-0237 with respect to the mirror surface of a dummy wafer. When the 180° peeling adhesion C of the pressure-sensitive adhesive layer, which is defined by JIS-Z-0237 with respect to the mirror surface of the dummy wafer, falls within the ranges, for example, adhesive strength between the pressure-sensitive adhesive layer and the dummy wafer becomes higher, and hence the cleaning sheet hardly peels from the dummy wafer during cleaning.

The thickness of the pressure-sensitive adhesive layer is preferably from 1 µm to 200 µm, more preferably from 2 µm to 100 µm, even more preferably from 3 µm to 80 µm, particularly preferably from 4 µm to 60 µm, most preferably from 5 µm to 50 µm.

1-4. Protective Film

The cleaning sheet according to at least one embodiment of the present disclosure may include a protective film for protecting, for example, the cleaning layer, the support, or the pressure-sensitive adhesive layer. The protective film may be peeled in an appropriate stage.

Any appropriate film may be adopted as the protective film to the extent that the effects of the present disclosure are not impaired. Examples of a material for such film include polyolefins, such as polyethylene, polypropylene, polybutene, polybutadiene, and polymethylpentene, polyvinyl chloride, a vinyl chloride copolymer, polyethylene terephthalate, polybutylene terephthalate, polyurethane, an ethylene vinyl acetate copolymer, an ionomer resin, an ethylene-(meth)acrylic acid copolymer, an ethylene-(meth)acrylic acid ester copolymer, polystyrene, polycarbonate, polyimide, and a fluorine resin.

The protective film may be subjected to any appropriate peeling treatment to the extent that the effects of the present disclosure are not impaired. The peeling treatment is typically performed with a peeling agent. Examples of the peeling agent may include a silicone-based peeling agent, a long-chain alkyl-based peeling agent, a fluorine-based peeling agent, a fatty acid amide-based peeling agent, and a silica-based peeling agent.

The protective film preferably has a thickness of from 1 μm to 100 μm.

A method of forming the protective film is appropriately selected in accordance with purposes, and the film may be formed by, for example, an injection molding method, an extrusion molding method, or a blow molding method.

1-5. Method of Producing Cleaning Sheet

Any appropriate production method may be adopted as a method of producing the cleaning sheet according to at least one embodiment of the present disclosure to the extent that the effects of the present disclosure are not impaired. Examples of such production method include: (1) a method including casting a varnish solution of the cleaning layer onto a support or a transfer member, uniformly forming the solution into a film with a spin coater or the like, and then heating the film to directly form the cleaning layer on the support or the transfer member; and (2) a method including forming a laminate formed of a separator and a pressure-sensitive adhesive film serving as a constituent material for a label and a reinforcing portion (a product obtained by arranging the cleaning layer on one surface of a label support and a typical pressure-sensitive adhesive layer on the other surface thereof) by, for example, a method including bonding the pressure-sensitive adhesive film onto the separator, then punching only the pressure-sensitive adhesive film of the laminate into the respective shapes of the label and/or the reinforcing portion simultaneously or separately, and peeling and removing an unnecessary pressure-sensitive adhesive film from the separator.

Because the effects of the present disclosure can be further expressed, a preferred example of the method of producing the cleaning sheet according to at least one embodiment of the present disclosure is a method of producing the cleaning sheet according to at least one embodiment of the present disclosure, the method including applying the varnish solution of the cleaning layer onto the support or the transfer member with a spin coater to form a film, leaving the film at rest as required, and heating and/or drying the film as required to form the cleaning layer on the support or the transfer member.

The viscosity of the varnish solution of the cleaning layer is preferably from 100 mPa·s to 2,000 mPa·s, more preferably from 300 mPa·s to 1,500 mPa·s, and even more preferably from 500 mPa·s to 1,200 mPa·s because the effects of the present disclosure can be further expressed.

The rotational speed at the time of the formation of the film by the application of the varnish solution of the cleaning layer onto the support or the transfer member with the spin coater is preferably 400 rpm or more, more preferably 600 rpm or more, even more preferably 800 rpm or more, even more preferably 1,000 rpm or more, even more preferably 1,500 rpm or more, particularly preferably 2,000 rpm or more, and most preferably 3,000 rpm or more because the effects of the present disclosure can be further expressed. The upper limit of the rotational speed is preferably 6,000 rpm or less because the effects of the present disclosure can be further expressed.

A spin time at the time of the formation of the film by the application of the varnish solution of the cleaning layer onto the support or the transfer member with the spin coater is preferably from 5 seconds to 200 seconds, more preferably from 10 seconds to 150 seconds, and even more preferably from 20 seconds to 60 seconds because the effects of the present disclosure can be further expressed.

In the method of producing the cleaning sheet according to at least one embodiment of the present disclosure, when the varnish solution of the cleaning layer is applied onto the support or the transfer member with the spin coater to form the film, and then the film is left at rest, the varnish solution can be further smoothed on the support or the transfer member. The time period for which the film is left at rest is preferably from 5 seconds to 1,000 seconds, more preferably from 30 seconds to 600 seconds, and even more preferably from 100 seconds to 400 seconds because the effects of the present disclosure can be further expressed.

In the method of producing the cleaning sheet according to at least one embodiment of the present disclosure, after the varnish solution of the cleaning layer has been applied onto the support or the transfer member with the spin coater to form the film, the film may be heated and/or dried. The temperature at which the heating or the drying is performed is preferably from 50° C. to 200° C., and more preferably from 80° C. to 150° C. because the effects of the present disclosure can be further expressed. The time period for which the heating or the drying is performed is preferably from 100 seconds to 900 seconds, more preferably from 300 seconds to 900 seconds, and even more preferably from 600 seconds to 900 seconds because the effects of the present disclosure can be further expressed.

2. Modified Transfer Member Provided with Cleaning Function

The modified transfer member provided with a cleaning function according to at least one embodiment of the present disclosure includes the cleaning sheet according to at least one embodiment of the present disclosure and a transfer member.

Figure 8:
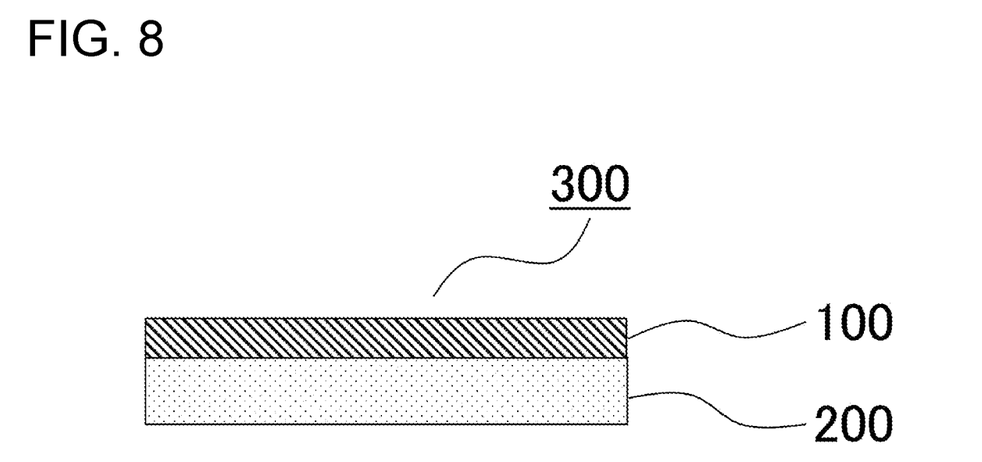
FIG. 8 is a schematic cross-sectional view for illustrating a transfer member provided with a cleaning function according to at least one embodiment of the present disclosure.

FIG. 8 is a schematic cross-sectional view for illustrating the modified transfer member provided with a cleaning function according to at least one embodiment of the present disclosure. In FIG. 8, a modified transfer member 300 provided with a cleaning function includes a cleaning sheet 100 and a transfer member 200. When the cleaning sheet 100 includes a pressure-sensitive adhesive layer, the outermost layer on the transfer member 200 side of the cleaning sheet 100 is preferably the pressure-sensitive adhesive layer.

Any appropriate transfer member may be adopted as the transfer member to the extent that the effects of the present disclosure are not impaired. Examples of such transfer member include: a semiconductor wafer (e.g., a silicon wafer); a substrate for a flat panel display, such as an LCD or a PDP; a compact disc; and a MR head. Of those transfer members, a semiconductor wafer (e.g., a silicon wafer) is typically given as an example of the transfer member when the transfer member is intended to clean a device for transferring a wafer in a substrate processing apparatus.

EXAMPLES

Now, the present disclosure is more specifically described by way of Examples and Comparative Examples. However, the present disclosure is by no means limited thereto. In the following description, the terms "part(s)" and "%" are by weight unless otherwise stated.

Method of Measuring Crown Size

A crown height and a crown width were measured with a stylus surface roughness measuring device (manufactured by Veeco Instruments Inc., Dektak 8). The measurement was performed by moving a stylus made of diamond (whose tip end portion had a curvature of 2.5 μm) at a measurement speed of 200 μm/sec in a measurement range of 10 mm. A point distant inward from the end portion of a resin layer on a wafer by 10 mm was defined as a measurement starting point, and the measurement was performed in a range of 10 mm from the starting point toward the outer peripheral portion thereof. The maximum height obtained during the measurement was defined as the crown height, and a distance from a point higher than the starting point by 0.5 μm to the end portion of the resin layer was defined as the crown width.

Evaluation of Adsorption Error

A vacuum adsorption stage is a circular shape having a diameter of 300 mm, and has circular convex portions arranged at equal intervals on its surface, the portions each having a diameter of 300 μm and a height of 300 μm. The stage has, at a site distant from its outer edge portion by 3 mm, a sealing band having a height of 300 μm and a width of 300 μm.

A transfer member provided with a cleaning function was mounted on the vacuum adsorption stage, and the pressure of air surrounding the member was reduced to −42,000 Pa. At that time, the member showing an adsorption pressure of −42,000 Pa or more and less than −35,000 Pa was evaluated as good (indicated by a circle symbol), the member showing an adsorption pressure of −35,000 Pa or more and less than −30,000 Pa was evaluated as fair (indicated by a triangle symbol), and the member showing an adsorption pressure of −30,000 Pa or more was evaluated as poor (indicated by an "x" symbol).

Example 1

Production of Varnish of Modified Polybenzoxazole 43.8 Grams of 4,4'-(hexafluoroisopropylidene)bis(2-aminophenol), 64.4 g of $H_2N-CH(CH_3)-CH_2-(O-CH(CH_3)-CH_2)_2-(O-CH_2CH_2CH_2CH_2)_9-(O-CH_2-CH(CH_3))_3-NH_2$ (product name: "ELASTAMINE RT-1000," manufactured by Huntsman Corporation, molecular weight: 1,000), 47.0 g of pyridine, and 600 g of N-methyl-2-pyrrolidone were loaded into a separable flask mounted with a stirring device, and the mixture was stirred at room temperature until 4,4'-(hexafluoroisopropylidene)bis(2-aminophenol) and the ELASTAMINE RT-1000 were completely dissolved. After that, 32.6 g of trimethylchlorosilane was dropped into the flask over 10 minutes, and the mixture was stirred for 60 minutes at room temperature. After that, 54.3 g of 4,4'-bis(chlorocarbonyl)diphenyl ether was slowly added to the flask over 10 minutes, and the mixture was stirred at room temperature for 1 hour.

The resultant synthesized liquid was dropped into 10 L of ion-exchanged water, and the resultant precipitate was dried at 120° C. for 4 hours. A 4-fold amount of N-methyl-2-pyrrolidone was added to the precipitate after the drying to redissolve the precipitate. Thus, the varnish of a modified polybenzoxazole (1) was obtained. The resultant varnish of the modified polybenzoxazole (1) had a viscosity of 540 mPa·s.

Production and Evaluation of Transfer Member Provided with Cleaning Function Including Cleaning Layer The resultant varnish of the modified polybenzoxazole (1) was applied onto the mirror surface of a 12-inch silicon wafer with a spin coater (manufactured by Tokyo Electron Limited, ACT-12, rotational speed=4,000 rpm, spin time=30 seconds), and was left at rest for 300 seconds. After that, the varnish was heated at 100° C. for 10 minutes so that N-methyl-2-pyrrolidone was removed. After that, the residue was heated under a vacuum at 280° C. for 2 hours. Thus, a transfer member (1) provided with a cleaning function including a cleaning layer (1) having a thickness of 2.8 μm was obtained. The transfer member (1) provided with a cleaning function includes a cleaning sheet (1) formed of the cleaning layer (1) and the silicon wafer serving as a transfer member.

The results are shown in Table 1.

Example 2

Production of Varnish of Modified Polybenzoxazole 54.0 Grams of 4,4'-(hexafluoroisopropylidene)bis(2-aminophenol), 66 g of $H_2N-CH(CH_3)-(O-CH_2-CH(CH_3))_n-NH_2$ (product name: "JEFFAMINE D-2000," manufactured by Huntsman Corporation, molecular weight: 2,000, n=about 33), 47.0 g of pyridine, and 600 g of N-methyl-2-pyrrolidone were loaded into a separable flask mounted with a stirring device, and the mixture was stirred at room temperature until 4,4'-(hexafluoroisopropylidene)bis(2-aminophenol) and the JEFFAMINE D-2000 were completely dissolved. After that, 48.0 g of trimethylchlorosilane was dropped into the flask over 10 minutes, and the mixture was stirred for 60 minutes at room temperature. After that, 55.2 g of 4,4'-bis(chlorocarbonyl)diphenyl ether was slowly added to the flask over 10 minutes, and the mixture was stirred at room temperature for 1 hour.

The resultant synthesized liquid was dropped into 10 L of ion-exchanged water, and the resultant precipitate was dried at 120° C. for 4 hours. A 4-fold amount of N-methyl-2-pyrrolidone was added to the precipitate after the drying to redissolve the precipitate. Thus, the varnish of a modified polybenzoxazole (2) was obtained. The resultant varnish of the modified polybenzoxazole (2) had a viscosity of 580 mPa·s.

Production and Evaluation of Transfer Member Provided with Cleaning Function Including Cleaning Layer The resultant varnish of the modified polybenzoxazole (2) was applied onto the mirror surface of a 12-inch silicon wafer with a spin coater (manufactured by Tokyo Electron Limited, ACT-12, rotational speed=1,000 rpm, spin time=30 seconds), and was left at rest for 300 seconds. After that, the varnish was heated at 100° C. for 10 minutes so that N-methyl-2-pyrrolidone was removed. After that, the residue was heated under a vacuum at 280° C. for 2 hours. Thus, a transfer member (2) provided with a cleaning function including a cleaning layer (2) having a thickness of 2.2 μm was obtained. The transfer member (2) provided with a cleaning function includes a cleaning sheet (2) formed of the cleaning layer (2) and the silicon wafer serving as a transfer member.

The results are shown in Table 1.

Example 3

Production of Varnish of Modified Polybenzoxazole 43.8 Grams of 4,4'-(hexafluoroisopropylidene)bis(2-aminophenol), 64.4 g of $H_2N$—$CH(CH_3)$—$CH_2$—(O—CH$(CH_3)$—$CH_2)_2$—(O—$CH_2CH_2CH_2CH_2)_9$—(O—$CH_2$—$CH(CH_3))_3$—$NH_2$ (product name: "ELASTAMINE RT-1000," manufactured by Huntsman Corporation, molecular weight: 1,000), 47.0 g of pyridine, and 600 g of N-methyl-2-pyrrolidone were loaded into a separable flask mounted with a stirring device, and the mixture was stirred at room temperature until 4,4'-(hexafluoroisopropylidene)bis(2-aminophenol) and the ELASTAMINE RT-1000 were completely dissolved. After that, 32.6 g of trimethylchlorosilane was dropped into the flask over 10 minutes, and the mixture was stirred for 60 minutes at room temperature. After that, 54.3 g of 4,4'-bis(chlorocarbonyl)diphenyl ether was slowly added to the flask over 10 minutes, and the mixture was stirred at room temperature for 2 hours.

The resultant synthesized liquid was dropped into 10 L of ion-exchanged water, and the resultant precipitate was dried at 120° C. for 4 hours. A 4-fold amount of N-methyl-2-pyrrolidone was added to the precipitate after the drying to redissolve the precipitate. Thus, the varnish of a modified polybenzoxazole (3) was obtained. The resultant varnish of the modified polybenzoxazole (3) had a viscosity of 980 mPa·s.

Production and Evaluation of Transfer Member Provided with Cleaning Function Including Cleaning Layer The resultant varnish of the modified polybenzoxazole (3) was applied onto the mirror surface of a 12-inch silicon wafer with a spin coater (manufactured by Tokyo Electron Limited, ACT-12, rotational speed=2,000 rpm, spin time=30 seconds), and was left at rest for 300 seconds. After that, the varnish was heated at 100° C. for 10 minutes so that N-methyl-2-pyrrolidone was removed. After that, the residue was heated under a vacuum at 280° C. for 2 hours. Thus, a transfer member (3) provided with a cleaning function including a cleaning layer (3) having a thickness of 5.4 μm was obtained. The transfer member (3) provided with a cleaning function includes a cleaning sheet (3) formed of the cleaning layer (3) and the silicon wafer serving as a transfer member.

The results are shown in Table 1.

Example 4

Production of Varnish of Modified Polybenzoxazole 43.8 Grams of 4,4'-(hexafluoroisopropylidene)bis(2-aminophenol), 64.4 g of $H_2N$—$CH(CH_3)$—$CH_2$—(O—CH$(CH_3)$—$CH_2)_2$—(O—$CH_2CH_2CH_2CH_2)_9$—(O—$CH_2$—$CH(CH_3))_3$—$NH_2$ (product name: "ELASTAMINE RT-1000," manufactured by Huntsman Corporation, molecular weight: 1,000), 47.0 g of pyridine, and 600 g of N-methyl-2-pyrrolidone were loaded into a separable flask mounted with a stirring device, and the mixture was stirred at room temperature until 4,4'-(hexafluoroisopropylidene)bis(2-aminophenol) and the ELASTAMINE RT-1000 were completely dissolved. After that, 32.6 g of trimethylchlorosilane was dropped into the flask over 10 minutes, and the mixture was stirred for 60 minutes at room temperature. After that, 54.3 g of 4,4'-bis(chlorocarbonyl)diphenyl ether was slowly added to the flask over 10 minutes, and the mixture was stirred at room temperature for 2 hours.

The resultant synthesized liquid was dropped into 10 L of ion-exchanged water, and the resultant precipitate was dried at 120° C. for 4 hours. A 4-fold amount of N-methyl-2-pyrrolidone was added to the precipitate after the drying to redissolve the precipitate. Thus, the varnish of a modified polybenzoxazole (4) was obtained. The resultant varnish of the modified polybenzoxazole (4) had a viscosity of 780 mPa·s.

Production and Evaluation of Transfer Member Provided with Cleaning Function Including Cleaning Layer The resultant varnish of the modified polybenzoxazole (4) was applied onto the mirror surface of a 12-inch silicon wafer with a spin coater (manufactured by Tokyo Electron Limited, ACT-12, rotational speed=1,000 rpm, spin time=30 seconds), and was left at rest for 300 seconds. After that, the varnish was heated at 100° C. for 10 minutes so that N-methyl-2-pyrrolidone was removed. After that, the residue was heated under a vacuum at 280° C. for 2 hours. Thus, a transfer member (4) provided with a cleaning function including a cleaning layer (4) having a thickness of 5.0 μm was obtained. The transfer member (4) provided with a cleaning function includes a cleaning sheet (4) formed of the cleaning layer (4) and the silicon wafer serving as a transfer member.

The results are shown in Table 1.

Example 5

Production of Varnish of Modified Polybenzoxazole 43.8 Grams of 4,4'-(hexafluoroisopropylidene)bis(2-aminophenol), 64.4 g of $H_2N$—$CH(CH_3)$—$CH_2$—(O—CH$(CH_3)$—$CH_2)_2$—(O—$CH_2CH_2CH_2CH_2)_9$—(O—$CH_2$—$CH(CH_3))_3$—$NH_2$ (product name: "ELASTAMINE RT-1000," manufactured by Huntsman Corporation, molecular weight: 1,000), 47.0 g of pyridine, and 600 g of N-methyl-2-pyrrolidone were loaded into a separable flask mounted with a stirring device, and the mixture was stirred at room temperature until 4,4'-(hexafluoroisopropylidene) bis(2-aminophenol) and the ELASTAMINE RT-1000 were completely dissolved. After that, 32.6 g of trimethylchlorosilane was dropped into the flask over 10 minutes, and the mixture was stirred for 60 minutes at room temperature. After that, 54.3 g of 4,4'-bis(chlorocarbonyl)diphenyl ether was slowly added to the flask over 10 minutes, and the mixture was stirred at room temperature for 2 hours.

The resultant synthesized liquid was dropped into 10 L of ion-exchanged water, and the resultant precipitate was dried at 120° C. for 4 hours. A 4-fold amount of N-methyl-2-pyrrolidone was added to the precipitate after the drying to redissolve the precipitate. Thus, the varnish of a modified polybenzoxazole (5) was obtained. The resultant varnish of the modified polybenzoxazole (5) had a viscosity of 840 mPa·s.

Production and Evaluation of Transfer Member Provided with Cleaning Function Including Cleaning Layer The resultant varnish of the modified polybenzoxazole (5) was applied onto the mirror surface of a 12-inch silicon wafer with a spin coater (manufactured by Tokyo Electron Limited, ACT-12, rotational speed=1,000 rpm, spin time=30 seconds), and was left at rest for 300 seconds. After that, the varnish was heated at 100° C. for 10 minutes so that N-methyl-2-pyrrolidone was removed. After that, the residue was heated under a vacuum at 280° C. for 2 hours. Thus, a transfer member (5) provided with a cleaning function including a cleaning layer (5) having a thickness of 6.2 μm was obtained. The transfer member (5) provided with a cleaning function includes a cleaning sheet (5) formed of the cleaning layer (5) and the silicon wafer serving as a transfer member.

The results are shown in Table 1.

Example 6

Production of Varnish of Modified Polybenzoxazole 43.8 Grams of 4,4'-(hexafluoroisopropylidene)bis(2-aminophenol), 64.4 g of $H_2N$—$CH(CH_3)$—$CH_2$—(O—CH($CH_3$)—$CH_2$)$_2$—(O—$CH_2CH_2CH_2CH_2$)$_9$—(O—$CH_2$—$CH(CH_3)$)$_3$—$NH_2$ (product name: "ELASTAMINE RT-1000," manufactured by Huntsman Corporation, molecular weight: 1,000), 47.0 g of pyridine, and 600 g of N-methyl-2-pyrrolidone were loaded into a separable flask mounted with a stirring device, and the mixture was stirred at room temperature until 4,4'-(hexafluoroisopropylidene) bis(2-aminophenol) and the ELASTAMINE RT-1000 were completely dissolved. After that, 32.6 g of trimethylchlorosilane was dropped into the flask over 10 minutes, and the mixture was stirred for 60 minutes at room temperature. After that, 54.3 g of 4,4'-bis(chlorocarbonyl)diphenyl ether was slowly added to the flask over 10 minutes, and the mixture was stirred at room temperature for 3 hours.

The resultant synthesized liquid was dropped into 10 L of ion-exchanged water, and the resultant precipitate was dried at 120° C. for 4 hours. A 4-fold amount of N-methyl-2-pyrrolidone was added to the precipitate after the drying to redissolve the precipitate. Thus, the varnish of a modified polybenzoxazole (6) was obtained. The resultant varnish of the modified polybenzoxazole (6) had a viscosity of 1,230 mPa·s.

Production and Evaluation of Transfer Member Provided with Cleaning Function Including Cleaning Layer The resultant varnish of the modified polybenzoxazole (6) was applied onto the mirror surface of a 12-inch silicon wafer with a spin coater (manufactured by Tokyo Electron Limited, ACT-12, rotational speed=1,000 rpm, spin time=30 seconds), and was left at rest for 300 seconds. After that, the varnish was heated at 100° C. for 10 minutes so that N-methyl-2-pyrrolidone was removed. After that, the residue was heated under a vacuum at 280° C. for 2 hours. Thus, a transfer member (6) provided with a cleaning function including a cleaning layer (6) having a thickness of 5.8 μm was obtained. The transfer member (6) provided with a cleaning function includes a cleaning sheet (6) formed of the cleaning layer (6) and the silicon wafer serving as a transfer member.

The results are shown in Table 1.

Example 7

Production of Varnish of Polyimide 51.0 Grams of 4,4'-diaminodiphenyl ether, 89 g of $H_2N$—$CH(CH_3)$—(O—$CH_2$—$CH(CH_3)$)$_n$—$NH_2$ (product name: "JEFFAMINE D-4000," manufactured by Huntsman Corporation, molecular weight: 4,000, n=about 68), and 1,000 g of N-methyl-2-pyrrolidone were loaded into a separable flask mounted with a stirring device, and the mixture was stirred at room temperature until 4,4'-diaminodiphenyl ether and the JEFFAMINE D-4000 were completely dissolved. After that, 60 g of pyromellitic anhydride was slowly added to the flask over 10 minutes, and the mixture was stirred at room temperature for 1 hour. The mixture was warmed to 70° C. and stirred for 4 hours to provide the varnish of a polyimide (7). The resultant varnish of the polyimide (7) had a viscosity of 1,000 mPa·s.

Production and Evaluation of Transfer Member Provided with Cleaning Function Including Cleaning Layer The resultant varnish of the polyimide (7) was applied onto the mirror surface of a 12-inch silicon wafer with a spin coater (manufactured by Tokyo Electron Limited, ACT-12, rotational speed=1,000 rpm, spin time=30 seconds), and was left at rest for 300 seconds. After that, the varnish was heated at 100° C. for 2 minutes so that N-methyl-2-pyrrolidone was removed. After that, the residue was heated under a vacuum at 280° C. for 2 hours. Thus, a transfer member (7) provided with a cleaning function including a cleaning layer (7) having a thickness of 7.0 μm was obtained. The transfer member (7) provided with a cleaning function includes a cleaning sheet (7) formed of the cleaning layer (7) and the silicon wafer serving as a transfer member.

The results are shown in Table 1.

Comparative Example 1

Production of Varnish of Modified Polybenzoxazole 43.8 Grams of 4,4'-(hexafluoroisopropylidene)bis(2-aminophenol), 64.4 g of $H_2N$—$CH(CH_3)$—$CH_2$—(O—CH($CH_3$)—$CH_2$)$_2$—(O—$CH_2CH_2CH_2CH_2$)$_9$—(O—$CH_2$—$CH(CH_3)$)$_3$—$NH_2$ (product name: "ELASTAMINE RT-1000," manufactured by Huntsman Corporation, molecular weight: 1,000), 47.0 g of pyridine, and 600 g of N-methyl-2-pyrrolidone were loaded into a separable flask mounted with a stirring device, and the mixture was stirred at room temperature until 4,4'-(hexafluoroisopropylidene) bis(2-aminophenol) and the ELASTAMINE RT-1000 were completely dissolved. After that, 32.6 g of trimethylchlorosilane was dropped into the flask over 10 minutes, and the mixture was stirred for 60 minutes at room temperature. After that, 54.3 g of 4,4'-bis(chlorocarbonyl)diphenyl ether was slowly added to the flask over 10 minutes, and the mixture was stirred at room temperature for 6 hours.

The resultant synthesized liquid was dropped into 10 L of ion-exchanged water, and the resultant precipitate was dried at 120° C. for 4 hours. A 4-fold amount of N-methyl-2-pyrrolidone was added to the precipitate after the drying to redissolve the precipitate. Thus, the varnish of a modified polybenzoxazole (according to Comparative Example 1, hereinafter C1) was obtained. The resultant varnish of the modified polybenzoxazole (C1) had a viscosity of 1,740 mPa·s.

Production and Evaluation of Transfer Member Provided with Cleaning Function Including Cleaning Layer The resultant varnish of the modified polybenzoxazole (C1) was applied onto the mirror surface of a 12-inch silicon wafer with a spin coater (manufactured by Tokyo Electron Limited, ACT-12, rotational speed=1,000 rpm, spin time=30 seconds), and was left at rest for 300 seconds. After that, the varnish was heated at 100° C. for 10 minutes so that N-methyl-2-pyrrolidone was removed. After that, the residue was heated under a vacuum at 280° C. for 2 hours. Thus, a transfer member (C1) provided with a cleaning function including a cleaning layer (C1) having a thickness of 9.0 μm was obtained. The transfer member (C1) provided with a cleaning function includes a cleaning sheet (C1) formed of the cleaning layer (C1) and the silicon wafer serving as a transfer member.

The results are shown in Table 1.

Comparative Example 2

Production of Varnish of Modified Polybenzoxazole 43.8 Grams of 4,4'-(hexafluoroisopropylidene)bis(2-aminophenol), 64.4 g of $H_2N—CH(CH_3)—CH_2—(O—CH(CH_3)—CH_2)_2—(O—CH_2CH_2CH_2CH_2)_9—(O—CH_2—CH(CH_3))_3—NH_2$ (product name: "ELASTAMINE RT-1000," manufactured by Huntsman Corporation, molecular weight: 1,000), 47.0 g of pyridine, and 600 g of N-methyl-2-pyrrolidone were loaded into a separable flask mounted with a stirring device, and the mixture was stirred at room temperature until 4,4'-(hexafluoroisopropylidene) bis(2-aminophenol) and the ELASTAMINE RT-1000 were completely dissolved. After that, 32.6 g of trimethylchlorosilane was dropped into the flask over 10 minutes, and the mixture was stirred for 60 minutes at room temperature. After that, 54.3 g of 4,4'-bis(chlorocarbonyl)diphenyl ether was slowly added to the flask over 10 minutes, and the mixture was stirred at room temperature for 2 hours.

The resultant synthesized liquid was dropped into 10 L of ion-exchanged water, and the resultant precipitate was dried at 120° C. for 4 hours. A 4-fold amount of N-methyl-2-pyrrolidone was added to the precipitate after the drying to redissolve the precipitate. Thus, the varnish of a modified polybenzoxazole (according to Comparative Example 2, hereinafter C2) was obtained. The resultant varnish of the modified polybenzoxazole (C2) had a viscosity of 880 mPa·s.

Production and Evaluation of Transfer Member Provided with Cleaning Function Including Cleaning Layer The resultant varnish of the modified polybenzoxazole (C2) was applied onto the mirror surface of a 12-inch silicon wafer with a spin coater (manufactured by Tokyo Electron Limited, ACT-12, rotational speed=800 rpm, spin time=30 seconds), and was left at rest for 300 seconds. After that, the varnish was heated at 100° C. for 10 minutes so that N-methyl-2-pyrrolidone was removed. After that, the residue was heated under a vacuum at 280° C. for 2 hours. Thus, a transfer member (C2) provided with a cleaning function including a cleaning layer (C2) having a thickness of 7.2 μm was obtained. The transfer member (C2) provided with a cleaning function includes a cleaning sheet (C2) formed of the cleaning layer (C2) and the silicon wafer serving as a transfer member.

The results are shown in Table 1.

Comparative Example 3

Production of Varnish of Modified Polybenzoxazole 43.8 Grams of 4,4'-(hexafluoroisopropylidene)bis(2-aminophenol), 64.4 g of $H_2N—CH(CH_3)—CH_2—(O—CH(CH_3)—CH_2)_2—(O—CH_2CH_2CH_2CH_2)_9—(O—CH_2—CH(CH_3))_3—NH_2$ (product name: "ELASTAMINE RT-1000," manufactured by Huntsman Corporation, molecular weight: 1,000), 47.0 g of pyridine, and 600 g of N-methyl-2-pyrrolidone were loaded into a separable flask mounted with a stirring device, and the mixture was stirred at room temperature until 4,4'-(hexafluoroisopropylidene) bis(2-aminophenol) and the ELASTAMINE RT-1000 were completely dissolved. After that, 32.6 g of trimethylchlorosilane was dropped into the flask over 10 minutes, and the mixture was stirred for 60 minutes at room temperature. After that, 54.3 g of 4,4'-bis(chlorocarbonyl)diphenyl ether was slowly added to the flask over 10 minutes, and the mixture was stirred at room temperature for 2 hours.

The resultant synthesized liquid was dropped into 10 L of ion-exchanged water, and the resultant precipitate was dried at 120° C. for 4 hours. A 4-fold amount of N-methyl-2-pyrrolidone was added to the precipitate after the drying to redissolve the precipitate. Thus, the varnish of a modified polybenzoxazole (according to Comparative Example 3, hereinafter C3) was obtained. The resultant varnish of the modified polybenzoxazole (C3) had a viscosity of 880 mPa·s.

Production and Evaluation of Transfer Member Provided with Cleaning Function Including Cleaning Layer The resultant varnish of the modified polybenzoxazole (C3) was applied onto the mirror surface of a 12-inch silicon wafer with a spin coater (manufactured by Tokyo Electron Limited, ACT-12, rotational speed=1,000 rpm, spin time=30 seconds), and was left at rest for 999 seconds. After that, the varnish was heated at 100° C. for 10 minutes so that N-methyl-2-pyrrolidone was removed. After that, the residue was heated under a vacuum at 280° C. for 2 hours. Thus, a transfer member (C3) provided with a cleaning function including a cleaning layer (C3) having a thickness of 6.9 μm was obtained. The transfer member (C3) provided with a cleaning function includes a cleaning sheet (C3) formed of the cleaning layer (C3) and the silicon wafer serving as a transfer member.

The results are shown in Table 1.

TABLE 1

|  |  | Example 1 | Example 2 | Example 3 | Example 4 | Example 5 | Example 6 | Example 7 |
|---|---|---|---|---|---|---|---|---|
| Kind of resin of cleaning layer | Polyimide-based resin | — | — | — | — | — | — | ○ |
|  | Polybenzoxazole-based resin | ○ | ○ | ○ | ○ | ○ | ○ | — |
| Soft segment |  | RT-1000 | D-2000 | RT-1000 | RT-1000 | RT-1000 | RT-1000 | D-4000 |
| Viscosity of varnish (mPa · s) |  | 540 | 580 | 980 | 780 | 840 | 1,230 | 1,000 |
| Rotational speed of spin coater (rpm) |  | 4,000 | 1,000 | 2,000 | 1,000 | 1,000 | 1,000 | 1,000 |
| Standing time after application (s) |  | 300 | 300 | 300 | 300 | 300 | 300 | 300 |
| Thickness (μm) |  | 2.8 | 2.2 | 5.4 | 5.0 | 6.2 | 5.8 | 7.0 |
| Crown height: L-T (μm) |  | 1.6 | 3.5 | 4.5 | 1.4 | 1.9 | 2.0 | 3.0 |
| Crown width: d (μm) |  | 600 | 1,500 | 1,000 | 3,650 | 3,900 | 4,000 | 1,200 |
| Evaluation of adsorption error |  | ○ | ○ | ○ | Δ | Δ | Δ | ○ |

|  |  | Comparative Example 1 | Comparative Example 2 | Comparative Example 3 |
|---|---|---|---|---|
| Kind of resin of cleaning layer | Polyimide-based resin | — | — | — |
|  | Polybenzoxazole-based resin | ○ | ○ | ○ |
| Soft segment |  | RT-1000 | RT-1000 | RT-1000 |
| Viscosity of varnish (mPa · s) |  | 1,740 | 880 | 880 |
| Rotational speed of spin coater (rpm) |  | 1,000 | 800 | 1,000 |
| Standing time after application (s) |  | 300 | 300 | 999 |
| Thickness (μm) |  | 9.0 | 7.2 | 6.9 |
| Crown height: L-T (μm) |  | 6.0 | 8.4 | 8.4 |
| Crown width: d (μm) |  | 5,700 | 3,600 | 3,500 |
| Evaluation of adsorption error |  | x | x | x |

The cleaning sheet and the modified transfer member provided with a cleaning function according to at least one embodiment of the present disclosure are each suitably used for cleaning of various kinds of substrate processing apparatus such as production apparatuses and inspection apparatuses.

According to at least one embodiment of the present disclosure, the cleaning sheet including a cleaning layer that may be suitably used for a transfer member to be transferred in a substrate processing apparatus, the cleaning sheet being capable of effectively suppressing an adsorption error when the cleaning layer is caused to adsorb to an adsorption stage or the like, can be provided. In addition, the modified transfer member provided with a cleaning function including such cleaning sheet and a transfer member can be provided.

What is claimed is:

1. A cleaning sheet, comprising:
  a cleaning layer that is substantially free of an adhesive ability and has a round shape, wherein
  a direction from a peripheral edge portion of a surface of the cleaning layer toward a center thereof when viewed from a normal direction with respect to the surface is defined as a center direction,
  a region occupied by a width of 10 mm from the peripheral edge portion toward the center direction in the surface is defined as a peripheral edge region, and
  a maximum thickness L of the cleaning layer in the normal direction in the peripheral edge region and an average thickness T of the cleaning layer in the normal direction in a remaining region of the cleaning layer excluding the peripheral edge region have a relationship of L−T≤5 μm, thereby forming a crown in the peripheral edge region surrounding the remaining region, and
  the maximum thickness L in the peripheral edge region is greater than a maximum thickness of the remaining region.

2. The cleaning sheet according to claim 1, wherein a portion having a thickness larger than the average thickness T in the cleaning layer by 1 μm or more has a width of 4,000 μm or less in the center direction.

3. The cleaning sheet according to claim 1, wherein the cleaning layer contains at least one kind selected from the group consisting of a polyimide-based resin and a polybenzoxazole-based resin.

4. The cleaning sheet according to claim 1, wherein the cleaning layer has a thickness of from 1 μm to 100 μm.

5. The cleaning sheet according to claim 1, further comprising a pressure-sensitive adhesive layer.

6. The cleaning sheet according to claim 1, further comprising a support.

7. A modified transfer member provided with a cleaning function, comprising:
  the cleaning sheet of claim 1; and
  a transfer member.

8. The cleaning sheet according to claim 1,
  wherein an average thickness of the peripheral edge region is greater than the average thickness T of the remaining region.

9. A cleaning sheet, comprising:
  a cleaning layer that is substantially free of an adhesive ability and has a round shape, wherein
  a direction from a peripheral edge portion of a surface of the cleaning layer toward a center thereof when viewed from a normal direction with respect to the surface is defined as a center direction,
  a region occupied by a width of 10 mm from the peripheral edge portion toward the center direction in the surface is defined as a peripheral edge region, and
  a maximum thickness L of the cleaning layer in the normal direction in the peripheral edge region and an average thickness T of the cleaning layer in the normal direction in a remaining region of the cleaning layer excluding the peripheral edge region have a relationship of L−T≤5 µm, thereby forming a crown in the peripheral edge region surrounding the remaining region, and as viewed from above, the crown is formed as a round ring surrounding the remaining region.

10. The cleaning sheet according to claim 9, wherein an axial cross section of the cleaning layer is substantially constant.

11. A cleaning sheet, comprising:

a cleaning layer that is substantially free of an adhesive ability and has a round shape, wherein a direction from a peripheral edge portion of a surface of the cleaning layer toward a center thereof when viewed from a normal direction with respect to the surface is defined as a center direction, a region occupied by a width of 10 mm from the peripheral edge portion toward the center direction in the surface is defined as a peripheral edge region, and a maximum thickness L of the cleaning layer in the normal direction in the peripheral edge region and an average thickness T of the cleaning layer in the normal direction in a remaining region of the cleaning layer excluding the peripheral edge region have a relationship of L−T≤5 µm, thereby forming a crown in the peripheral edge region surrounding the remaining region, and the remaining portion is substantially flat.

\* \* \* \* \*